United States Patent
Li et al.

(10) Patent No.: US 9,899,084 B2
(45) Date of Patent: Feb. 20, 2018

(54) DATA STORAGE METHOD AND PHASE CHANGE MEMORY

(71) Applicant: Huawei Technologies Co., Ltd., Shenzhen (CN)

(72) Inventors: Zhen Li, Wuhan (CN); Qiang He, Wuhan (CN); Xiangshui Miao, Wuhan (CN); Ronggang Xu, Shenzhen (CN); Junfeng Zhao, Shenzhen (CN); Shujie Zhang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/412,509

(22) Filed: Jan. 23, 2017

(65) Prior Publication Data

US 2017/0133089 A1 May 11, 2017

Related U.S. Application Data

(63) Continuation of application No. PCT/CN2014/082917, filed on Jul. 24, 2014.

(51) Int. Cl.
*G11C 11/56* (2006.01)
*G11C 13/00* (2006.01)

(52) U.S. Cl.
CPC ...... *G11C 13/0069* (2013.01); *G11C 11/5678* (2013.01); *G11C 13/0097* (2013.01); *G11C 2013/0092* (2013.01)

(58) Field of Classification Search
CPC ............ G11C 13/0069; G11C 13/0097; G11C 11/5678; G11C 2013/009
See application file for complete search history.

(56) References Cited

U.S. PATENT DOCUMENTS 4,228,524 A * 10/1980 Neale ................. G11C 13/0004
257/1
7,327,602 B2 * 2/2008 Kostylev ............ G11C 13/0004
365/163

(Continued)

FOREIGN PATENT DOCUMENTS

CN 1536688 A 10/2004
CN 1996492 A 7/2007

(Continued)

OTHER PUBLICATIONS

Machine Translation and Abstract of Chinese Publication No. CN101763891, Jun. 30, 2010, 8 pages.

(Continued)

*Primary Examiner* — Khamdan Alrobaie
(74) *Attorney, Agent, or Firm* — Conley Rose, P.C.

(57) ABSTRACT

A data storage method applying to the phase change memory and a phase change memory are provided. After obtaining to-be-stored data, the phase change memory generates an erase pulse signal and a write pulse signal according to the to-be-stored data. The to-be-stored data is multi-bit data. The write pulse signal is a signal including at least two consecutive pulses with a same amplitude. The amplitude of the at least two consecutive pulses is a value determined according to the to-be-stored data. Then, the phase change memory applies the erase pulse signal to a storage unit of the phase change memory to allow the storage unit to switch to a crystalline state. Further, the write pulse signal is applied to the storage unit to allow the storage unit to switch to an amorphous state corresponding to a first resistance value, where the amorphous state represents the to-be-stored data.

14 Claims, 7 Drawing Sheets

(56) References Cited

U.S. PATENT DOCUMENTS

| | | | |
|---|---|---|---|
| 8,036,014 B2* | 10/2011 | Lee | G11C 13/0004 |
| | | | 365/148 |
| 8,107,283 B2 | 1/2012 | Chen | |
| 8,149,608 B2 | 4/2012 | Lee | |
| 8,238,147 B2 | 8/2012 | Bae et al. | |
| 9,324,428 B1* | 4/2016 | Chien | G11C 11/5607 |
| 9,378,821 B1 | 6/2016 | Prabhakar et al. | |
| 2002/0040994 A1 | 4/2002 | Nitta et al. | |
| 2003/0226749 A1 | 12/2003 | Asa | |
| 2004/0202017 A1 | 10/2004 | Lee | |
| 2007/0070682 A1* | 3/2007 | Nakashima | G11C 13/0007 |
| | | | 365/148 |
| 2007/0153570 A1 | 7/2007 | Suh | |
| 2008/0144353 A1 | 6/2008 | Lung | |
| 2008/0266802 A1 | 10/2008 | Weiss et al. | |
| 2009/0034324 A1* | 2/2009 | Kim | G11C 11/5678 |
| | | | 365/163 |
| 2009/0046495 A1 | 2/2009 | Shimaoka et al. | |
| 2009/0225583 A1* | 9/2009 | Lee | G11C 13/0007 |
| | | | 365/148 |
| 2010/0067290 A1* | 3/2010 | Savransky | G11C 13/0004 |
| | | | 365/163 |
| 2010/0067291 A1 | 3/2010 | Fuji | |
| 2010/0165725 A1* | 7/2010 | Bedeschi | G11C 11/56 |
| | | | 365/163 |
| 2011/0128773 A1* | 6/2011 | Azuma | G11C 13/0007 |
| | | | 365/148 |
| 2013/0044534 A1 | 2/2013 | Kawai et al. | |
| 2013/0270503 A1 | 10/2013 | Mia et al. | |
| 2014/0078811 A1 | 3/2014 | Kawai et al. | |
| 2016/0232971 A1* | 8/2016 | Yoon | G11C 13/0097 |

FOREIGN PATENT DOCUMENTS

| | | |
|---|---|---|
| CN | 101202110 A | 6/2008 |
| CN | 101699562 A | 4/2010 |
| CN | 101763891 A | 6/2010 |
| CN | 101777380 A | 7/2010 |
| CN | 102142517 A | 8/2011 |
| CN | 103093815 A | 5/2013 |
| CN | 103093816 A | 5/2013 |
| JP | 2004014450 A | 1/2004 |

OTHER PUBLICATIONS

Machine Translation and Abstract of Chinese Publication No. CN103093815, May 8, 2013, 8 pages.

Bedeschi, F., et al., "A Bipolar-Selected Phase Change Memory Featuring Multi-Level Cell Storage," IEEE Journal of Solid-State Circuits, vol. 44, No. 1, Jan. 2009, pp. 217-227.

Yin, Y., et al., "Controlled promotion of crystallization for application to multilevel phase-change memory," Applied Physics Letters 100, May 10, 2012, 5 pages.

Papandreou, N., et al., "Multilevel Phase-Change Memory," ICECS, 2010, pp. 1017-1020.

Pantazi, A., et al., "Multilevel Phase-Change Memory Modeling and Experimental Characterization," E*Pcos, 2009, pp. 34-41.

Shi, L., et al., "Study of the Partial Crystallization Properties of Phase-Change Optical Recording Disks," Japanese Journal of Applied Physics, vol. 38, 1999, pp. 1645-1648.

Foreign Communication From a Counterpart Application, PCT Application No. PCT/CN2014/082918, English Translation of International Search Report dated Apr. 1, 2015, 2 pages.

Foreign Communication From a Counterpart Application, PCT Application No. PCT/CN2014/082918, English Translation of Written Opinion dated Apr. 1, 2015, 8 pages.

Foreign Communication From a Counterpart Application, PCT Application No. PCT/CN2014/082917, English Translation of International Search Report dated Apr. 28, 2015, 2 pages.

Foreign Communication From a Counterpart Application, PCT Application No. PCT/CN2014/082917, English Translation of Written Opinion dated Apr. 28, 2015, 7 pages.

Office Action dated Jun. 2, 2017, 8 pages, U.S. Appl. No. 15/412,795, filed Jan. 23, 2017.

\* cited by examiner

DATA STORAGE METHOD AND PHASE CHANGE MEMORY

CROSS-REFERENCE TO RELATED APPLICATIONS

This application is a continuation of International Application No. PCT/CN2014/082917, filed on Jul. 24, 2014, the disclosure of which is hereby incorporated by reference in its entirety.

TECHNICAL FIELD

Embodiments of the present disclosure relate to data storage technologies, and in particular, to a data storage method and a phase change memory.

BACKGROUND

A phase change memory (PCM) is a novel nonvolatile memory that develops fastest currently. The phase change memory uses different resistance values represented by phase change materials in a crystalline state and in an amorphous state to store corresponding data, and is widely applied to a rewritable compact disc (CD) and a rewritable digital versatile disc (DVD). To meet a requirement of massive information storage, research on high-density storage of the phase change memory appears to be particularly important. Conventional methods for implementing a high-density phase change memory include reducing an area of a phase change unit and reducing an area of a peripheral circuit. The former needs to improve a component structure and is limited by a photolithography size, and the latter needs to optimize an integrated circuit design.

To resolve the foregoing problem, a multi-valued storage technology arises. Different from a conventional binary storage method, the multi-valued storage technology can make full use of a resistance difference between a crystalline state and an amorphous state of a phase change material, and store at least two bits of data in one storage unit. In the prior art, a method for implementing multi-valued storage in a phase change memory generally includes an erase process (or SET) and a write process (or RESET). The erase process is to apply a pulse with a low amplitude and a long pulse width to a storage unit of the phase change memory, so that the storage unit is in a stable low-resistance crystalline state. The write process is to apply a single pulse with a high amplitude and a short pulse width to a storage unit so that the storage unit is in a high-resistance amorphous state. Because a resistance value of the storage unit of the phase change memory changes according to a width and an amplitude of an applied programming pulse, by applying single-pulses with different amplitudes and different pulse widths to the storage unit, the storage unit may have amorphous states corresponding to different resistance values. The amorphous states corresponding to different resistance values correspond to different storage states, so as to implement the multi-valued storage in the phase change memory.

In the prior art, multi-valued storage is implemented using a single pulse with a high amplitude and a short pulse width. However, applying a single pulse with a high amplitude and a short pulse width to a storage unit of a phase change memory causes a temperature of the storage unit to increase extremely fast, generating thermal crosstalk.

SUMMARY

Embodiments of the present disclosure provide a data storage method and a phase change memory, to resolve a thermal crosstalk problem generated when implementing multi-valued storage in the phase change memory in the prior art.

According to a first aspect, an embodiment of the present disclosure provides a data storage method for a phase change memory, including obtaining to-be-stored data, where the to-be-stored data is multi-bit data; generating an erase pulse signal and a write pulse signal according to the to-be-stored data, where the write pulse signal is a signal including at least two consecutive pulses, the at least two consecutive pulses have a same amplitude, and the amplitude of the at least two consecutive pulses is a value determined according to the to-be-stored data; applying the erase pulse signal to a storage unit of the phase change memory to allow the storage unit to switch to a crystalline state; and applying the write pulse signal to the storage unit to allow the storage unit to switch to an amorphous state corresponding to a first resistance value, where the first resistance value and the amplitude of the at least two consecutive pulses meet a specific function relationship, so as to represent the to-be-stored data using the amorphous state corresponding to the first resistance value of the storage unit.

According to the first aspect, in a first possible implementation manner of the first aspect, the method further includes determining whether the to-be-stored data is maximum data or minimum data in the multi-bit data; and the generating an erase pulse signal and a write pulse signal according to the to-be-stored data includes generating the erase pulse signal and the write pulse signal according to the to-be-stored data when the to-be-stored data is not the maximum data or the minimum data in the multi-bit data.

According to the first possible implementation manner of the first aspect, in a second possible implementation manner, the method further includes generating the erase pulse signal according to the to-be-stored data when the to-be-stored data is the maximum data or the minimum data in the multi-bit data, and applying the erase pulse signal to the storage unit to allow the storage unit to switch to the crystalline state, so as to represent the to-be-stored data using the crystalline state of the storage unit.

According to any one of the first aspect, or the first or the second possible implementation manner of the first aspect, in a third possible implementation manner, the at least two consecutive pulses have a same pulse width.

According to the third possible implementation manner of the first aspect, in a fourth possible implementation manner, a pulse width range of the at least two consecutive pulses is 30 nanoseconds (ns) to 50 ns.

According to any one of the first aspect, or the first to the fourth possible implementation manners of the first aspect, in a fifth possible implementation manner, a range of an interval between the at least two consecutive pulses is 5 ns to 15 ns.

According to any one of the first aspect, or the first to the fifth possible implementation manners of the first aspect, in a sixth possible implementation manner, the erase pulse signal and the write pulse signal are voltage signals; or the erase pulse signal and the write pulse signal are current signals.

According to the sixth possible implementation manner of the first aspect, in a seventh possible implementation manner, the write pulse signal is a voltage signal including at least two consecutive pulses, and an amplitude range of each of the at least two consecutive pulses is 0.5 volts (V) to 1.5 V.

According to a second aspect, an embodiment of the present disclosure further provides a control apparatus for a phase change memory, including an obtaining module configured to obtain to-be-stored data, where the to-be-stored data is multi-bit data; a generation module configured to generate an erase pulse signal and a write pulse signal according to the to-be-stored data, where the write pulse signal is a signal including at least two consecutive pulses, the at least two consecutive pulses have a same amplitude, and the amplitude of the at least two consecutive pulses is a value determined according to the to-be-stored data; and a control module configured to apply the erase pulse signal to a storage unit of the phase change memory to allow the storage unit to switch to a crystalline state, and apply the write pulse signal to the storage unit to allow the storage unit to switch to an amorphous state corresponding to a first resistance value, where the first resistance value and the amplitude of the at least two consecutive pulses meet a specific function relationship, so as to represent the to-be-stored data using the amorphous state corresponding to the first resistance value of the storage unit.

According to a second aspect, in a first possible implementation manner of the second aspect, the control apparatus further includes a determining module configured to determine whether the to-be-stored data is maximum data or minimum data in the multi-bit data; where the generation module is further configured to generate the erase pulse signal and the write pulse signal according to the to-be-stored data when the to-be-stored data is not the maximum data or the minimum data in the multi-bit data.

According to a first possible implementation manner of the second aspect, in a second possible implementation manner, the generation module is further configured to generate the erase pulse signal according to the to-be-stored data when the to-be-stored data is the maximum data or the minimum data in the multi-bit data; and the control module is further configured to apply the erase pulse signal to the storage unit to allow the storage unit to switch to a crystalline state, so as to represent the to-be-stored data using the crystalline state of the storage unit.

According to a third aspect, an embodiment of the present disclosure further provides a control apparatus for a phase change memory, including a processor and a control bus, where the processor is connected to a storage unit of the phase change memory using the control bus; and the processor is configured to execute the data storage method for the phase change memory according to the first aspect, and control, using the control bus, the storage unit to perform data storage.

According to a fourth aspect, an embodiment of the present disclosure further provides a computer readable medium, including a computer-executable instruction for a processor of a computer to invoke and execute, where the computer-executable instruction includes computer instructions corresponding to the data storage method for the phase change memory according to the first aspect.

According to the data storage method and the phase change memory provided in the embodiments of the present disclosure, a write pulse signal including at least two consecutive pulses is generated according to to-be-stored data, and the write pulse signal is applied to a storage unit of the phase change memory to allow the storage unit to switch to an amorphous state corresponding to a resistance value that is corresponding to the to-be-stored data, so as to represent the to-be-stored data, thereby implementing multi-valued storage in a single storage unit. Because the write pulse signal includes at least two consecutive pulses, a tempera- ture increase of the storage unit at a time can be reduced, and a thermal crosstalk problem caused by excessive heat can be relieved.

BRIEF DESCRIPTION OF DRAWINGS

To describe the technical solutions in the embodiments of the present disclosure or in the prior art more clearly, the following briefly describes the accompanying drawings required for describing the embodiments or the prior art. Apparently, the accompanying drawings in the following description show some embodiments of the present disclosure.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. Apparently, the described embodiments are some but not all of the embodiments of the present disclosure.

Figure 1:
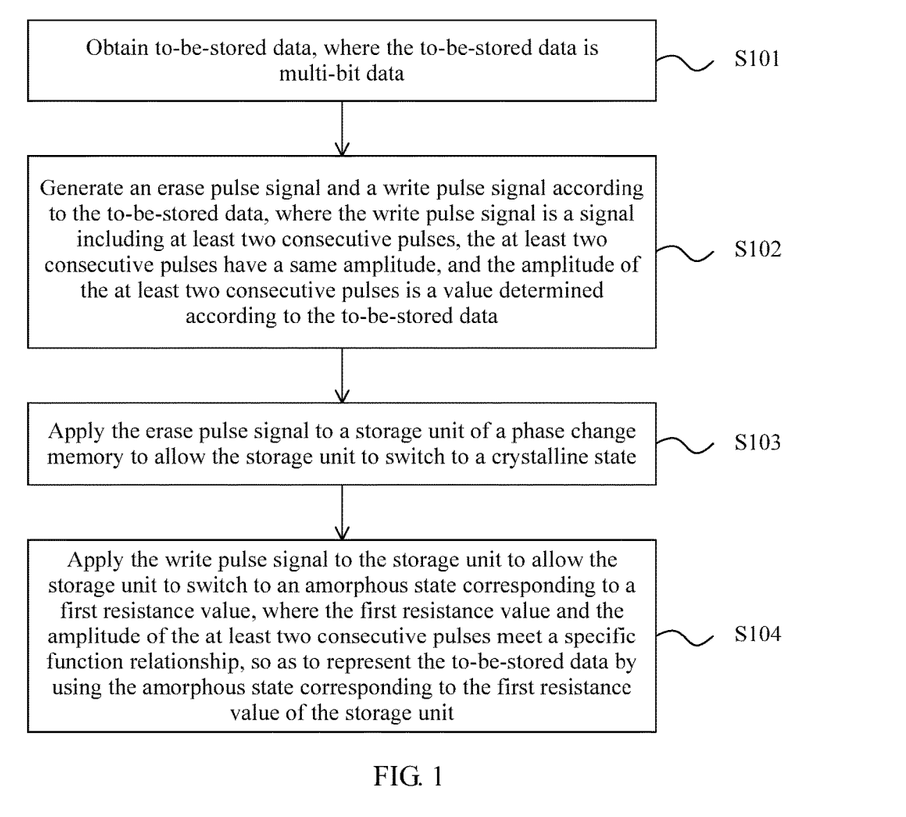
FIG. 1 is a flowchart of a data storage method for a phase change memory according to Embodiment 1 of the present disclosure.

An embodiment provides a data storage method for a phase change memory. A write pulse signal may be generated according to multi-bit to-be-stored data, where the write pulse signal is a signal including at least two consecutive pulses, the at least two consecutive pulses have a same amplitude, and the amplitude of the at least two consecutive pulses needs to be determined according to the multi-bit to-be-stored data; and the write pulse signal may be applied to the storage unit to allow the storage unit to switch to an amorphous state corresponding to a first resistance value. The first resistance value is related to an amplitude of the write pulse signal. Therefore, using write pulse signals of different amplitudes, the storage unit may have amorphous states corresponding to different resistance values to respectively record different multi-bit data, so as to implement multi-valued storage in a single storage unit. In the foregoing process, because the write pulse signal is a signal including at least two consecutive pulses, in comparison with the prior art, the amplitude of the write pulse signal can be effectively reduced, and a temperature increase of the storage unit to which a pulse is applied at a time can be effectively reduced, thereby resolving a thermal crosstalk problem generated in multi-valued storage that is implemented using a single pulse with a high amplitude and a short pulse width in the prior art. FIG. 1 is a flowchart of a data storage method for a phase change memory according to Embodiment 1 of the present disclosure. As shown in FIG. 1, the method specifically includes the following steps.

Step 101: Obtain to-be-stored data, where the to-be-stored data is multi-bit data.

The multi-bit data may be multi-bit binary data. The to-be-stored data may be received data that is input from the outside, or may be data that is preconfigured in a storage unit of the phase change memory, or may be data generated according to a preconfigured data generation rule. If the to-be-stored data is n-bit data, the to-be-stored data may be any one of $2^n$ pieces of data.

Step 102: Generate an erase pulse signal and a write pulse signal according to the to-be-stored data, where the write pulse signal is a signal including at least two consecutive pulses, the at least two consecutive pulses have a same amplitude, and the amplitude of the at least two consecutive pulses is a value determined according to the to-be-stored data.

In this embodiment of the present disclosure, different to-be-stored data may be represented using different resistance values of the storage unit of the phase change memory. A resistance value of the storage unit is closely related to an amorphous degree of a phase change material layer of the storage unit, the amorphous degree depends on a temperature of the phase change material layer, and a phase change material may be heated to different temperatures by applying electrical pulses with different parameters. Therefore, write pulse signals with different amplitudes may be generated according to different to-be-stored data, so that the storage unit in amorphous states corresponding to different resistance values stores the different to-be-stored data, thereby implementing multi-valued storage. When the write pulse signal is a signal including at least two consecutive pulses, a temperature increase of the storage unit to which a pulse is applied at a time can be reduced, thereby improving a thermal crosstalk problem generated by multi-valued storage that is implemented using a single pulse with a high amplitude and a short pulse width in the prior art.

The at least two consecutive pulses may have a same amplitude, and the amplitude of the at least two consecutive pulses may be determined according to the to-be-stored data. For example, a preset amplitude range may be divided into $2^n$ equal parts, and the amplitude of the at least two consecutive pulses is determined according to a location of the to-be-stored data in the $2^n$ pieces of data sorted in ascending or descending order. That is, amplitudes corresponding to the adjacent to-be-stored data are amplitudes corresponding to adjacent equal parts. It should be noted that in an actual application situation, the amplitudes of the at least two consecutive pulses corresponding to the adjacent to-be-stored data further need to be fine-tuned according to a quantity of the at least two consecutive pulses, a pulse width of a single pulse, and an interval between adjacent pulses. Specifically, if the quantity of the at least two consecutive pulses is relatively large, the corresponding amplitude is relatively small. Correspondingly, if the quantity of the at least two consecutive pulses is relatively small, the corresponding amplitude is relatively large. If the pulse width of the single pulse is relatively long, the corresponding amplitude is relatively small. If the pulse width of the single pulse is relatively short, the corresponding amplitude is relatively large. If the interval between the adjacent pulses is relatively small, the corresponding amplitude is relatively large. If the interval between the adjacent pulses is relatively large, the corresponding amplitude is relatively small.

For another example, alternatively, the amplitude of the at least two consecutive pulses may be a value obtained according to the to-be-stored data using a preset data write pulse amplitude correspondence table. If the to-be-stored data is n-bit data, the preset data write pulse amplitude correspondence table includes at least write pulse amplitudes corresponding respectively to $2^n$ pieces of data. For the write pulse amplitudes corresponding respectively to the at least $2^n$ pieces of data in the preset data write pulse amplitude correspondence table, before step 102, all data of the to-be-stored data are tested according to a quantity of bits of the to-be-stored data, to obtain pulse amplitudes required for storing the data by corresponding resistance values for amorphous states. The to-be-stored data and the corresponding pulse amplitudes are stored to obtain the data write pulse amplitude correspondence table.

Step 103: Apply the erase pulse signal to a storage unit of the phase change memory to allow the storage unit to switch to a crystalline state.

Because in an initial state, the storage unit is mostly in an amorphous state, to ensure stability and accuracy of a resistance value corresponding to an amorphous state that represents the to-be-stored data, the erase pulse signal needs to be applied to the storage unit, so that the storage unit is in a stable crystalline state. Generally, a resistance value of the storage unit in the crystalline state is less than a resistance value of the storage unit in the amorphous state.

The erase pulse signal may include at least one pulse signal with a low amplitude and a long pulse width. If the erase pulse signal is a signal including one pulse, an amplitude of the pulse may be less than a preset amplitude. The preset amplitude may be a corresponding pulse amplitude when a phase change material layer of the storage unit is heated to a melting temperature. A pulse width of the erase pulse is longer than a time period required for heating the phase change material layer of the storage unit to a crystallization temperature according to the pulse whose amplitude is less than the preset amplitude. The amplitude of the pulse included in the erase pulse signal may range from 0.5 V to 1.5 V, and the pulse width of the pulse included in the erase pulse signal may range from 100 ns to 300 ns. Because heat required when the phase change material layer of the storage unit is heated to the melting temperature is constant, if the erase pulse signal includes at least two consecutive pulses, a pulse amplitude of the erase pulse signal is less than a pulse amplitude corresponding to a situation when the erase pulse signal includes one pulse. The pulse amplitude of the erase pulse signal and a specific quantity of pulses in the erase pulse signal may be determined according to a material of the phase change material layer of the storage unit or an internal structure of the storage unit. For example, if the erase pulse signal is a signal including one pulse, the erase pulse signal may be a signal including an electrical pulse with an amplitude of 1.1 V and a pulse width of 300 ns.

Step 104: Apply the write pulse signal to the storage unit to allow the storage unit to switch to an amorphous state corresponding to a first resistance value, where the first resistance value and the amplitude of the at least two consecutive pulses meet a specific function relationship, so as to represent the to-be-stored data using the amorphous state corresponding to the first resistance value of the storage unit.

The write pulse signal is applied to the storage unit to allow the phase change material layer to switch to the amorphous state corresponding to the first resistance value. The phase change material layer of the storage unit is heated using Joule heat generated by the write pulse signal, and the phase change material layer is heated above the melting temperature and is rapidly cooled below the crystallization temperature, to allow the phase change material layer to switch to the amorphous state corresponding to the first resistance value. The first resistance value and the amplitude of the at least two consecutive pulses meet a specific function relationship. In this case, the first resistance value is greater than a resistance value of the storage unit in the crystalline state.

A resistance value R of the storage unit in the amorphous state is closely related to a non-crystallization rate $C_a$ of the phase change material layer, and the following formula (1): $R=(1-C_a)R_{c0}+C_aR_{a0}$ (1) is met. In the formula (1), R represents the resistance value of the storage unit in the amorphous state, $C_a$ represents the non-crystallization rate of the phase change material layer, and $R_{c0}$ and $R_{a0}$ are resistance values of the storage unit in a complete crystalline state and in a complete amorphous state respectively. For a phase change material layer with a specific material, $R_{c0}$ and $R_{a0}$ are fixed and may be obtained in advance according to an experiment.

The non-crystallization rate $C_a$ actually is a ratio of a volume $V_a$ of the phase change material layer in a non-crystallization area to a total volume $V_{GST}$ of the phase change material layer, and may be represented using the following formula (2):

$$C_a = \frac{\int V_a dt}{V_{GST}}. \qquad (2)$$

The volume $V_a$ of the phase change material layer in the non-crystallization area may be determined according to a critical temperature $T_a$ between crystallization and non-crystallization of the phase change material layer and a melting temperature $T_m$ of the phase change material layer using the following formula (3):

$$\frac{dV_a}{dt} = \left(\frac{dV_a}{dt}\right)_c \theta(T_m - T_a) + \left(\frac{dV_a}{dt}\right)_a \theta(T_a - T_m). \qquad (3)$$

For a phase change memory, if a material of a phase change material layer of a storage unit of the phase change memory is known and determined, a melting temperature $T_m$ of the phase change material layer is known.

The critical temperature $T_a$ between crystallization and non-crystallization of the phase change material layer may be obtained using the following formula (4) according to the heat that is applied to the phase change material layer, that is, the Joule heat generated by the applied write pulse:

$$T_a = \int \frac{W_j - W_d}{C} dt. \qquad (4)$$

In the foregoing formula, $W_d$ is dissipated power, that is, consumed power, and $W_j$ is the Joule heat generated by the applied write pulse signal and may be obtained according to a parameter such as an amplitude of the write pulse signal. Therefore, the resistance value of the storage unit in the amorphous state, that is, the first resistance value, and the pulse amplitude of the applied write pulse signal, that is, the amplitude of the at least two consecutive pulses, meet the foregoing function relationship.

Since the pulse amplitude of the write pulse signal is determined according to the to-be-stored data, different to-be-stored data corresponds to write pulse signals with different pulse amplitudes. When the write pulse signals with different amplitudes are applied to the storage unit, different heat is generated. Therefore, the phase change material layer of the storage unit is certainly heated to different temperatures, and the different temperatures also result in different resistance values corresponding to amorphous states. The storage unit in the amorphous states corresponding to the different resistance values may be used to respectively represent different to-be-stored data. When the write pulse signals with the different amplitudes are applied to the storage unit, the obtained resistance values corresponding to the storage unit in the amorphous states are different. A difference between resistance values corresponding to adjacent amplitudes is relatively large and is greater than a preset threshold.

The amplitude of the at least two consecutive pulses is greater than the amplitude of the erase pulse signal, and the pulse width of the at least two consecutive pulses is less than the pulse width of the erase pulse signal. In the solution of this embodiment, the amplitude of the at least two consecutive pulses may be greater than the preset amplitude, and the preset amplitude may be a corresponding pulse amplitude when the phase change material layer of the storage unit is heated to the melting temperature.

Because heat required when the phase change material layer of the storage unit is heated to the melting temperature is constant, the amplitude of the write pulse signal that includes at least two consecutive pulses is certainly less than an amplitude of a write pulse signal that includes a single pulse. Therefore, the write pulse signal is applied to the storage unit, to reduce a temperature increase of the storage unit to which a pulse is applied at a time, thereby relieving or avoiding a thermal crosstalk problem caused by excessive heat.

In the solution of this embodiment, for any to-be-stored data, the corresponding to-be-stored data may be represented using an amorphous state corresponding to a resistance value and by applying a combination of an erase pulse signal and a write pulse signal. That is, in the solution of this embodiment, the storage unit in the crystalline state may not store any data.

In the solution of this embodiment, corresponding data may be stored and recorded according to a resistance value or a current value of the storage unit. In the solution, the storage unit with a larger resistance value or a smaller current value may store and record small data or large data. A correspondence between the resistance value or the current value of the storage unit and the stored and recorded data may be preconfigured.

It should be noted that when the write pulse signal is applied to the storage unit, a smaller amplitude of the write pulse signal indicates a larger resistance value of by the storage unit in an amorphous state.

In the solution of this embodiment, a write pulse signal whose amplitude is determined according to multi-bit to-be-stored data is applied to a storage unit to allow the storage unit to switch to an amorphous state corresponding to a resistance value corresponding to the to-be-stored data, so as to represent the to-be-stored data, so as to implement multi-valued storage in a single storage unit. Because the write pulse signal includes at least two consecutive pulses, a temperature increase of the storage unit to which a pulse is applied at a time is reduced, and a thermal crosstalk problem caused by excessive heat is relieved or avoided.

In addition, the included at least two consecutive pulses are used to reduce power that is required for applying the write pulse signal, and reduce a difficulty in controlling the amplitude of the write pulse signal by a pulse generation circuit. Because there are few adjustment parameters, fine control on the resistance value of the storage unit in the amorphous state may be further implemented, resistance values of the storage unit in different amorphous states are better controlled, more resistance states are achieved, and stability of storing multi-valued data by the storage unit is improved. Because write pulse signals of different to-be-stored data are different only in amplitude, the pulse generation circuit is simple in structure.

Figure 2:
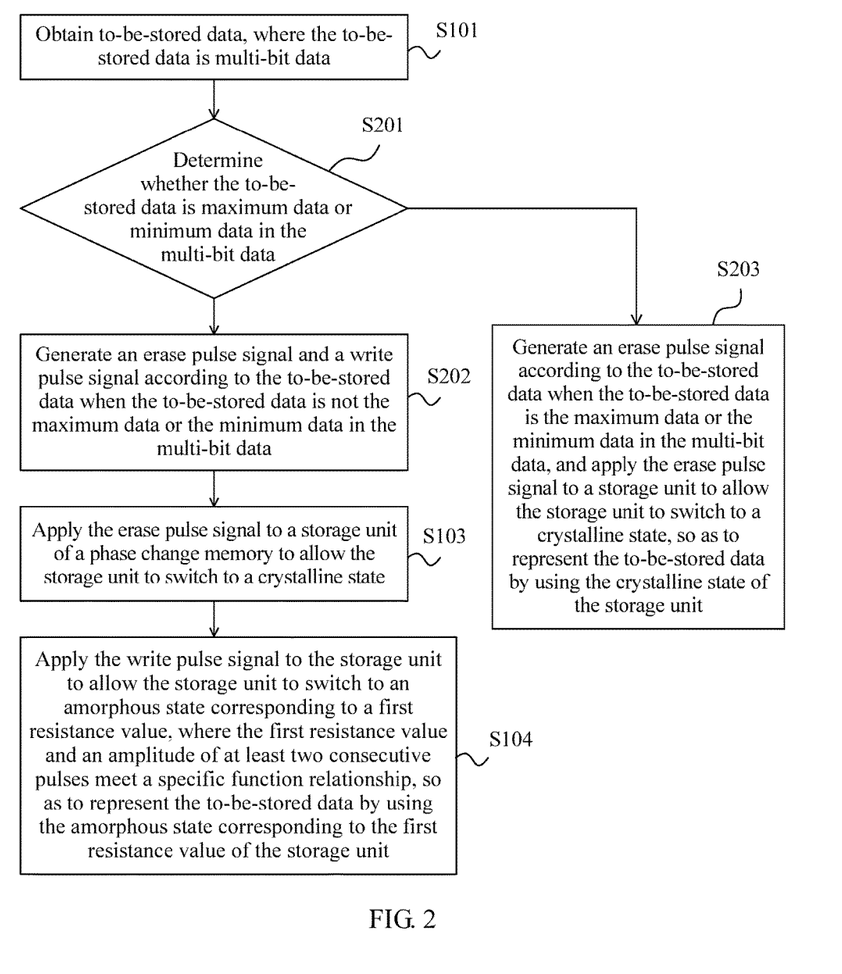
FIG. 2 is a flowchart of a data storage method for a phase change memory according to Embodiment 2 of the present disclosure.

An embodiment further provides a data storage method for a phase change memory. Different from the foregoing embodiment in which amorphous states corresponding to different resistance values of the phase change memory are used to store all data, in the solution of this embodiment, a part of data may be stored using a crystalline state of the phase change memory, and the remaining data may be stored using amorphous states corresponding to different resistance values of the phase change memory. The part of data that is stored using the crystalline state may be maximum data or minimum data in multi-bit data. If the part of data is the maximum data in the multi-bit data, the remaining data stored using the amorphous states corresponding to the different resistance values is other data in the multi-bit data except the maximum data. If the part of data is the minimum data in the multi-bit data, the remaining data stored using the amorphous states corresponding to the different resistance values is other data in the multi-bit data except the minimum data. FIG. 2 is a flowchart of a data storage method for a phase change memory according to Embodiment 2 of the present disclosure. As shown in FIG. 2, before the generating an erase pulse signal and a write pulse signal according to the to-be-stored data in step 102 in the foregoing solution, the solution further includes the following.

Step 201: Determine whether the to-be-stored data is maximum data or minimum data in the multi-bit data.

If the to-be-stored data is two-bit data, in the two-bit data, 00 is the minimum data and 11 is the maximum data. Step 201 actually is determining whether the to-be-stored data is 00 or 11.

Preferably, the generating an erase pulse signal and a write pulse signal according to the to-be-stored data in step 102 includes the following.

Step 202: Generate the erase pulse signal and the write pulse signal according to the to-be-stored data when the to-be-stored data is not the maximum data or the minimum data in the multi-bit data.

It should be noted that, the foregoing step 103 and step 104 need to be further executed after step 202, and the amorphous state corresponding to the first resistance value is used to represent the to-be-stored data.

However, in the solution of this embodiment, for data except the maximum data or the minimum data in the multi-bit data, a manner of applying a combination of the erase pulse signal and the write pulse signal is used, and an amorphous state corresponding to a resistance value is used to represent corresponding to-be-stored data.

Based on the foregoing solution, further, the method further includes the following.

Step 203: Generate the erase pulse signal according to the to-be-stored data when the to-be-stored data is the maximum data or the minimum data in the multi-bit data, and apply the erase pulse signal to the storage unit to allow the storage unit to switch to a crystalline state, so as to represent the to-be-stored data using the crystalline state of the storage unit.

For the maximum data or the minimum data in the multi-bit data, a solution of applying only the write pulse signal may be used, and the crystalline state is used to represent the maximum data or the minimum data. That is, in the solution of this embodiment, the storage unit in the crystalline state may store the maximum data or the minimum data in the multi-bit data.

It should be noted that if the maximum data is represented using the crystalline state, a solution of generating a corresponding write pulse signal according to the minimum data and then applying the write pulse signal is still required for the minimum data, and an amorphous state for a corresponding resistance value is used to represent the minimum data. Correspondingly, if the minimum data is represented using the crystalline state, a solution of generating a corresponding write pulse signal according to the maximum data and then applying the write pulse signal is still required for the maximum data, and an amorphous state of a corresponding resistance value is used to represent the maximum data.

Whether the crystalline state of the storage unit represents the maximum data or the minimum data may be determined according to a predetermined data storage rule. If the data storage rule is sequentially storing the multi-bit data in an ascending order according to an ascending order of resistance values of the storage unit, the minimum data is represented using the crystalline state. If the data storage rule is sequentially storing the multi-bit data in an ascending order according to an ascending order of internal current values during an electrical connection of the storage unit, the maximum data is represented using the crystalline state.

Preferably, in any one of the foregoing solutions of this embodiment, the at least two consecutive pulses have a same width.

Further, a pulse width range of the at least two consecutive pulses may be 30 ns to 50 ns.

According to a structure of the phase change material layer of the storage unit and/or a structure of the storage unit, a corresponding pulse width may be selected in the pulse width range.

Based on the foregoing solutions, a range of an interval between the at least two consecutive pulses is 5 ns to 15 ns.

Because an interval exists between the at least two consecutive pulses, the write pulse signal including the at least two consecutive pulses is applied to the storage unit, and the storage unit may make full use of heat that is generated when a previous pulse is applied. Therefore, a sum of amplitudes of the at least two consecutive pulses is less than a pulse amplitude of an applied write pulse signal that includes a single pulse. That is, when the write pulse signal is applied to the storage unit, total power required for applying the write pulse signal may further be reduced, so as to reduce power consumption.

Still further, the erase pulse signal and the write pulse signal are voltage signals, or the erase pulse signal and the write pulse signal are current signals.

If the write pulse signal is a voltage signal including at least two consecutive pulses, an amplitude range of the at least two consecutive pulses is preferably 0.5 V to 1.5 V.

To ensure stability of different stored multi-bit data, resistance values of the storage unit, in amorphous states, for storing the different to-be-stored multi-bit data need to have an obvious difference, so as to read and distinguish between the different resistance values. For example, assuming that the to-be-stored data is any one of four pieces of two-bit data 00, 01, 10, and 11, pulse amplitudes of write pulse signals determined according to the four pieces of data are preferably 0.5 V, 0.9 V, 1.2 V, and 1.5 V. In an solution of this embodiment, for two adjacent resistance values corresponding to different amorphous states, the larger resistance value is at least ten times greater than the smaller one.

If the write pulse signals with the four different pulse amplitudes are applied to the storage unit, four different amorphous states are obtained respectively. The four amorphous states have different resistance values respectively. A write pulse signal with a larger amplitude corresponds to an amorphous state with a larger resistance value and a smaller current value. That is, when the write pulse signal with the pulse amplitude of 1.5 V is applied to the storage unit, a maximum resistance value of the storage unit in an amorphous state is obtained. It is assumed that the storage unit stores data in an ascending order according to an ascending order of current values, that is, according to a descending order of resistance values. If the to-be-stored data is 00, it may be determined, according to the to-be-stored data, that the pulse amplitude of the write pulse signal is 1.5 V, and the storage unit is allowed to switch to an amorphous state with a resistance value of 1 mega-ohm (MΩ) when the write pulse signal is applied to the storage unit. If the to-be-stored data is 01, it may be determined, according to the to-be-stored data, that the pulse amplitude of the write pulse signal is 1.2 V, and the storage unit is allowed to switch to an amorphous state with a resistance value of 100 kilo-ohms (kΩ) when the write pulse signal is applied to the storage unit. If the to-be-stored data is 10, it may be determined, according to the to-be-stored data, that the pulse amplitude of the write pulse signal is 0.9 V, and the storage unit is allowed to switch to an amorphous state with a resistance value of 10 kΩ when the write pulse signal is applied to the storage unit. If the to-be-stored data is 11, it may be determined, according to the to-be-stored data, that the pulse amplitude of the write pulse signal is 0.5 V, and the storage unit is allowed to switch to an amorphous state with a resistance value of 10 ohms (Ω) when the write pulse signal is applied to the storage unit.

Figure 3A:
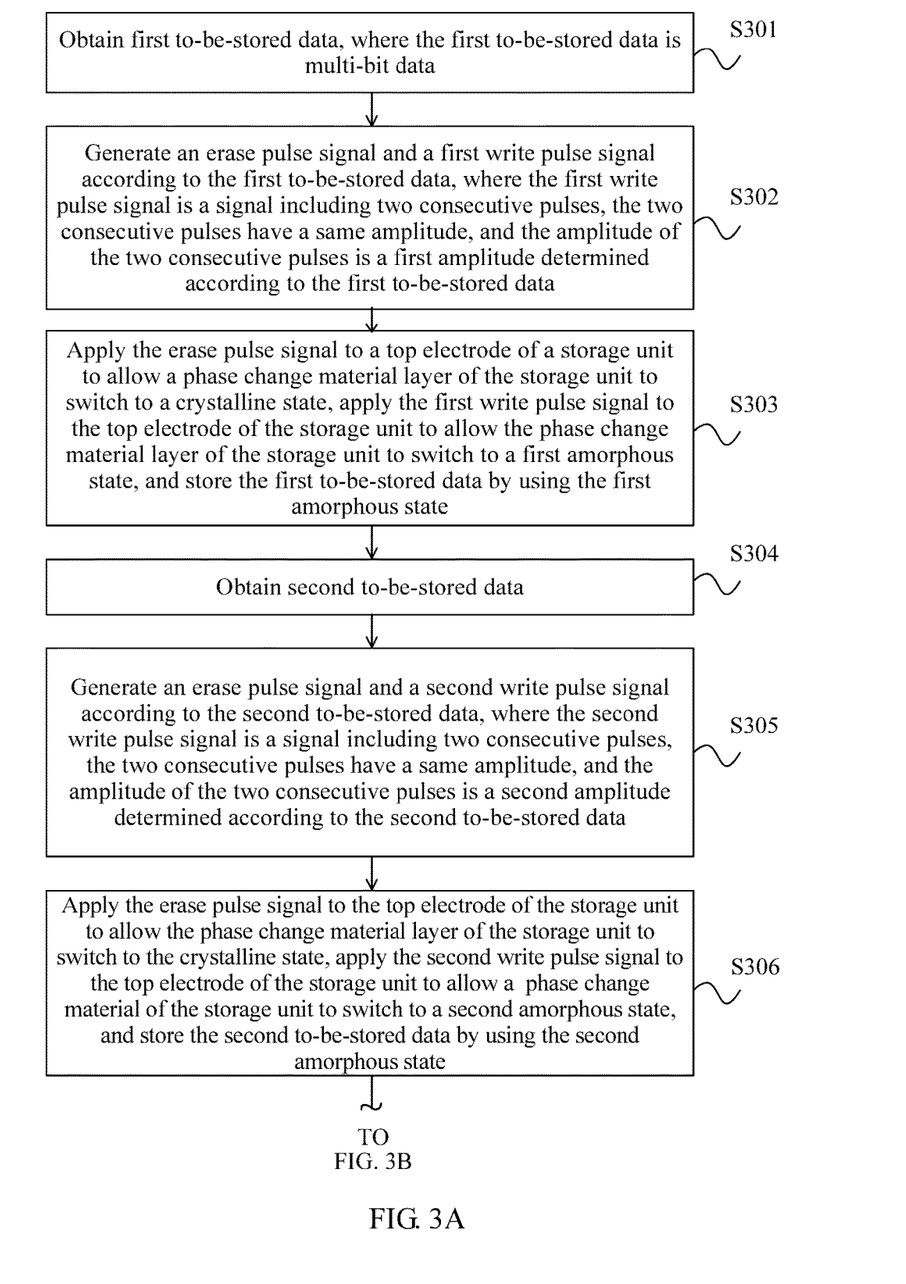
FIG. 3A and FIG. 3B are a flowchart of a data storage method for a phase change memory according to Embodiment 3 of the present disclosure.
Figure 3B:
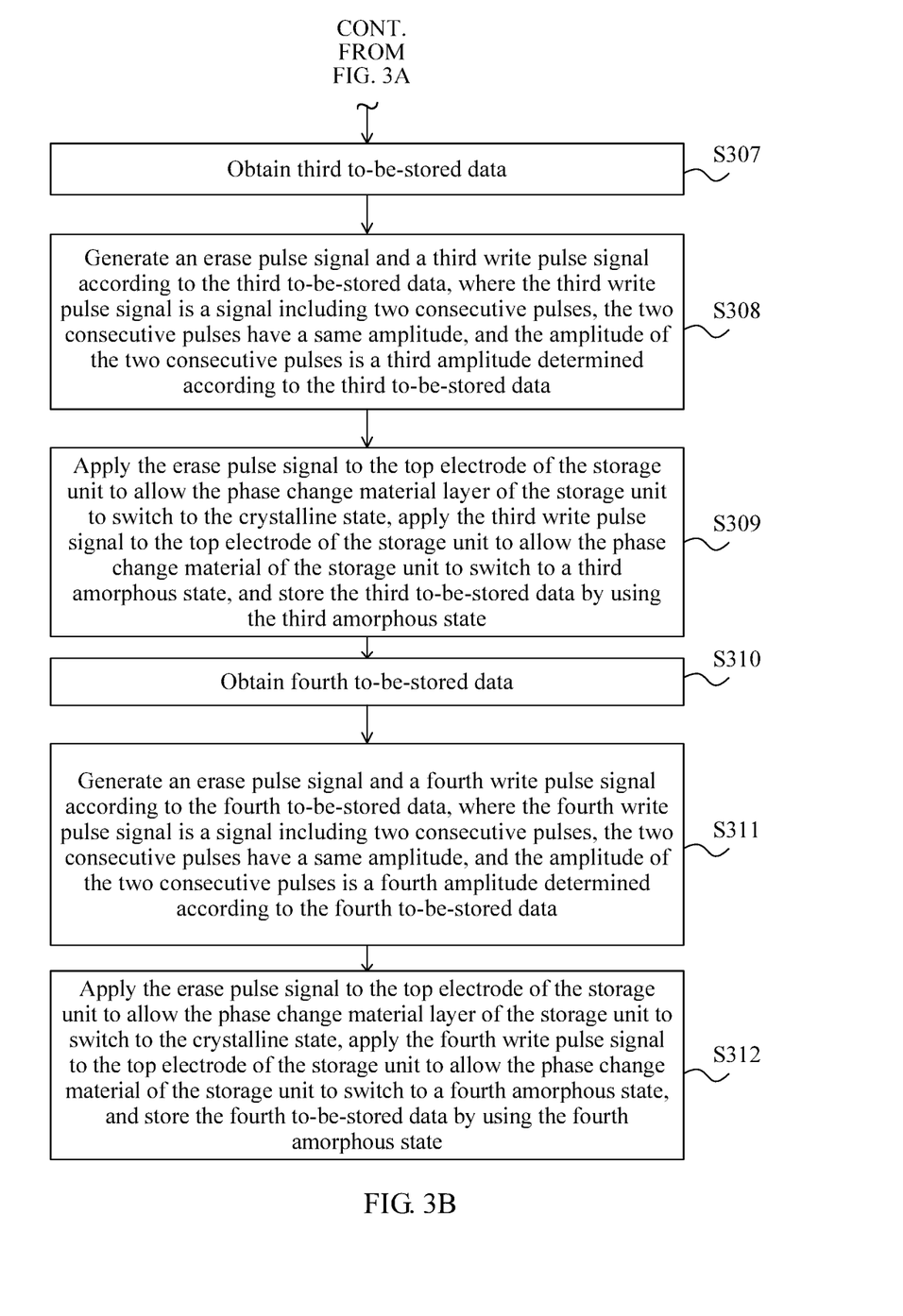

An embodiment further provides a data storage method for a phase change memory. In this embodiment, the foregoing solutions of the foregoing embodiments are illustrated using a specific example. FIG. 3A and FIG. 3B are a flowchart of a data storage method for a phase change memory according to Embodiment 3 of the present disclosure. As shown in FIG. 3A and FIG. 3B, the method includes the following steps.

Step 301: Obtain first to-be-stored data, where the first to-be-stored data is multi-bit data.

The to-be-stored data may be obtained according to a preconfigured data generation rule. In this embodiment, a storage unit may store two-bit data. The data generation rule may be a rule generating data in an ascending order, and the first to-be-stored data may be 00.

Step 302: Generate an erase pulse signal and a first write pulse signal according to the first to-be-stored data, where the first write pulse signal is a signal including two consecutive pulses, the two consecutive pulses have a same amplitude, and the amplitude of the two consecutive pulses is a first amplitude determined according to the first to-be-stored data.

If the first write pulse signal and the erase pulse signal are voltage signals, the first amplitude may be 1.5 V. The first write pulse signal is a signal including two consecutive pulses each with an amplitude of 1.5 V and a pulse width of 30 ns. A time interval exists between the two consecutive pulses, for example, 10 ns. The erase pulse signal may be an electrical pulse with an amplitude of 1.1 V and a pulse width of 300 ns.

Step 303: Apply the erase pulse signal to a top electrode of a storage unit to allow a phase change material layer of the storage unit to switch to a crystalline state; apply the first write pulse signal to the top electrode of the storage unit to allow the phase change material layer of the storage unit to switch to a first amorphous state; and store the first to-be-stored data using the first amorphous state.

Figure 4:
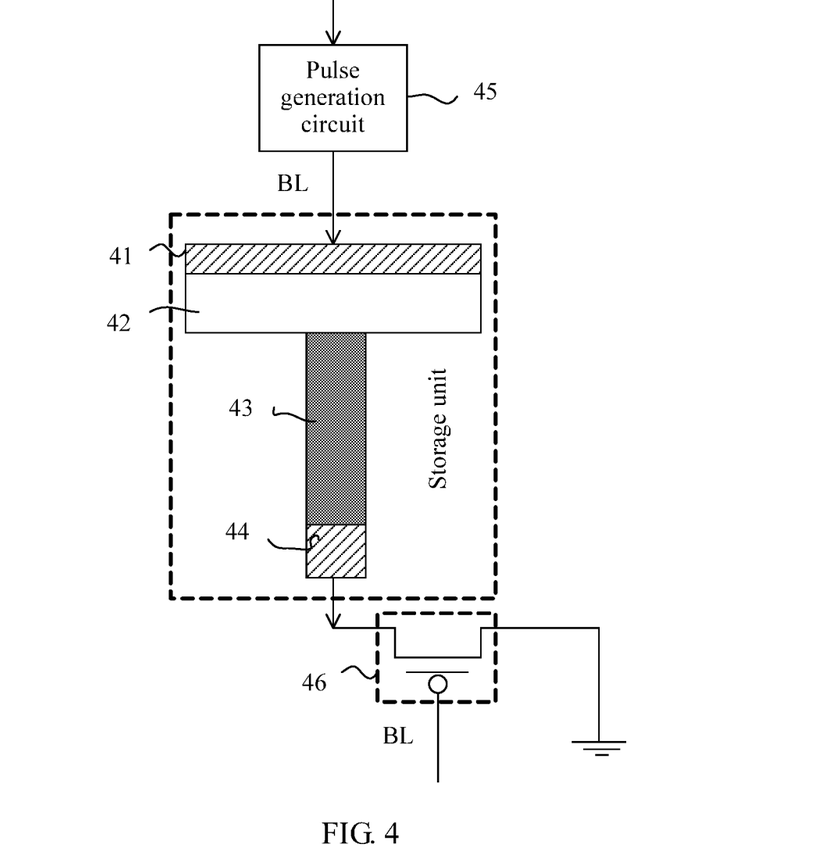
FIG. 4 is a schematic circuit connection diagram of a storage unit of a phase change memory.

FIG. 4 is a schematic circuit connection diagram of a storage unit of a phase change memory. As shown in FIG. 4, the storage unit is in a T-shape structure and includes a top electrode 41, a bottom electrode 44, a phase change material layer 42, and a heating layer 43. Both the top electrode 41 and the bottom electrode 44 are made of conductive materials, for example, a metal aluminum electrode. The phase change material layer 42 uses a germanium-antimony-tellurium (GST) material. The top electrode 41 may be connected to an output end of a pulse generation circuit 45 using a bit line (BL), so as to receive an applied erase pulse or an applied write pulse. The bottom electrode 44 may be connected to a gate electrode of a selection transistor 46. A drain electrode of the selection transistor 46 is grounded. A connectivity status of the selection transistor 46 is controlled using a voltage of a BL.

After the top electrode 41 of the storage unit is connected to the output end of the pulse generation circuit and receives the erase pulse signal, the erase pulse signal may be used to heat the phase change material layer 42, so as to generate Joule heat. A temperature of the heated phase change material layer 42 is above a crystallization temperature and below a melting temperature of the phase change material layer. In this embodiment, for example, the crystallization temperature may be 400 kelvin (K), and the melting temperature may be 600 K.

A resistance value of the first amorphous state may be, for example, 1 MΩ.

Step 304: Obtain second to-be-stored data.

The second to-be-stored data may be 01.

Step 305: Generate an erase pulse signal and a second write pulse signal according to the second to-be-stored data, where the second write pulse signal is a signal including two consecutive pulses, the two consecutive pulses have a same amplitude, and the amplitude of the two consecutive pulses is a second amplitude determined according to the second to-be-stored data.

The second amplitude may be 1.2 V. A pulse width and a pulse interval of the second write pulse signal may be the same as those of the first write pulse signal. The erase pulse signal may be the same as the foregoing erase pulse signal.

Step 306: Apply the erase pulse signal to the top electrode of the storage unit to allow the phase change material layer of the storage unit to switch to the crystalline state, and apply the second write pulse signal to the top electrode of the storage unit to allow the phase change material layer of the storage unit to switch to a second amorphous state; and store the second to-be-stored data using the second amorphous state.

The second write pulse signal is applied to the top electrode of the storage unit, so that the phase change material layer of the storage unit may switch to the second amorphous state, for example, an amorphous state corresponding to a resistance value of 100 kn.

Step 307: Obtain third to-be-stored data.

The third to-be-stored data may be 10.

Step 308: Generate an erase pulse signal and a third write pulse signal according to the third to-be-stored data, where the third write pulse signal is a signal including two consecutive pulses, the two consecutive pulses have a same amplitude, and the amplitude of the two consecutive pulses is a third amplitude determined according to the third to-be-stored data.

The third amplitude may be 0.9 V. A pulse width and a pulse interval of the third write pulse signal may be the same as those of the first write pulse signal. The erase pulse signal may be the same as the foregoing erase pulse signal, and may be an electrical pulse with an amplitude of 1.1 V and a pulse width of 300 ns.

Step 309: Apply the erase pulse signal to the top electrode of the storage unit to allow the phase change material layer of the storage unit to switch to the crystalline state; apply the third write pulse signal to the top electrode of the storage unit to allow the phase change material layer of the storage unit to switch to a third amorphous state; and store the third to-be-stored data using the third amorphous state.

The third write pulse signal with an amplitude of 0.9 V is applied to the top electrode of the storage unit, so that the phase change material layer of the storage unit may switch to the third amorphous state, for example, an amorphous state corresponding to a resistance value of 10 kn.

Step 310: Obtain fourth to-be-stored data.

The fourth to-be-stored data may be 11.

Step 311: Generate an erase pulse signal and a fourth write pulse signal according to the fourth to-be-stored data, where the fourth write pulse signal is a signal including two consecutive pulses, the two consecutive pulses have a same amplitude, and the amplitude of the two consecutive pulses is a fourth amplitude determined according to the fourth to-be-stored data.

The fourth amplitude may be 0.5 V. A pulse width and a pulse interval of the fourth write pulse signal may be the same as those of the first write pulse signal. The erase pulse signal may be the same as the foregoing erase pulse signal.

Step 312: Apply the erase pulse signal to the top electrode of the storage unit to allow the phase change material layer of the storage unit to switch to the crystalline state; apply the fourth write pulse signal to the top electrode of the storage unit to allow the phase change material layer of the storage unit to switch to a fourth amorphous state; and store the fourth to-be-stored data using the fourth amorphous state.

The write pulse signal with an amplitude of 0.5 V is applied to the top electrode of the storage unit, so that the phase change material layer of the storage unit may switch to the fourth amorphous state, for example, an amorphous state corresponding to a resistance value of 10Ω.

In this embodiment, the storage unit may have four amorphous states corresponding to different resistance values, and the crystalline state. According to the different resistance values, the amorphous states of the storage unit are in ascending order as follows: the first amorphous state, the second amorphous state, the third amorphous state, and the fourth amorphous state. The first amorphous state, the second amorphous state, the third amorphous state, and the fourth amorphous state of the storage unit may store 00, 01, 10, and 11 respectively, so as to store four pieces of two-bit data.

Though the write pulse signal including two same pulses is only a preferable solution of this embodiment, the present disclosure is not limited thereto. Alternatively, the solution may be implemented using a writing pulse signal including more than two same pulses.

According to this embodiment, specifically, a write pulse signal whose amplitude is determined according to to-be-stored data is applied to a storage unit to allow the storage unit to switch to an amorphous state corresponding to a resistance value corresponding to the to-be-stored data, and the corresponding to-be-stored multi-bit data is stored, so that multi-bit data storage in a single storage unit is implemented. A write pulse signal including two consecutive pulses is used to implement multi-bit data storage in a single storage unit, so as to improve storage density of the storage unit.

Figure 5:
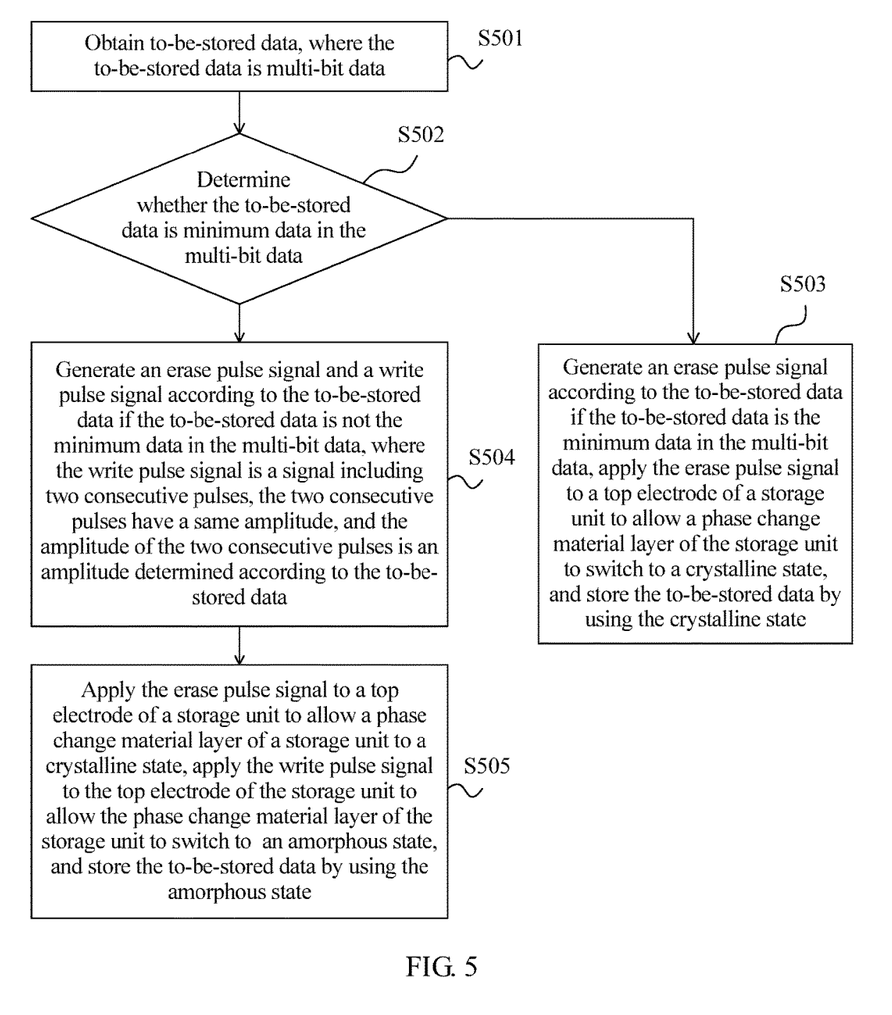
FIG. 5 is a flowchart of a data storage method for a phase change memory according to Embodiment 4 of the present disclosure.

An embodiment further provides a data storage method for a phase change memory. In this embodiment, the foregoing solutions of the foregoing embodiments are illustrated using a specific example. FIG. 5 is a flowchart of a data storage method for a phase change memory according to Embodiment 4 of the present disclosure. As shown in FIG. 5, the method specifically includes the following steps.

Step 501: Obtain to-be-stored data, where the to-be-stored data is multi-bit data.

Step 502: Determine whether the to-be-stored data is minimum data in the multi-bit data.

The to-be-stored data may be obtained according to a preconfigured data generation rule, or the obtained to-be-stored data may be data that is input using an external input device. Determining whether the to-be-stored data is the minimum data in the multi-bit data actually is determining whether each bit of the to-be-stored data is 0. If each bit of the to-be-stored data is 0, the to-be-stored data is the minimum data in the multi-bit data.

Step 503: Generate an erase pulse signal according to the to-be-stored data if the to-be-stored data is the minimum data in the multi-bit data, apply the erase pulse signal to a top electrode of a storage unit to allow a phase change material layer of the storage unit to switch to a crystalline state, and store the to-be-stored data using the crystalline state.

Step 504: Generate an erase pulse signal and a write pulse signal according to the to-be-stored data if the to-be-stored data is not the minimum data in the multi-bit data, where the write pulse signal is a signal including two consecutive pulses, the two consecutive pulses have a same amplitude, and the amplitude of the two consecutive pulses is an amplitude determined according to the to-be-stored data.

Step 505: Apply the erase pulse signal to a top electrode of a storage unit to allow the phase change material layer of the storage unit to switch to the crystalline state, apply the write pulse signal to the top electrode of the storage unit to allow the phase change material layer of the storage unit to switch to an amorphous state, and store the to-be-stored data using the amorphous state.

In this embodiment, the crystalline state may be used to store the minimum data in the multi-bit data. Correspondingly, alternatively, the crystalline state may be used to store the maximum data in the multi-bit data. Corresponding method steps are similar to those in the foregoing embodiment, and details are not repeatedly described herein.

In this embodiment, the foregoing solutions of the foregoing embodiments are specifically described by using an example in which the crystalline state to store the minimum data in the multi-bit data, and beneficial effects of this embodiment are similar to those of the foregoing embodiments, and details are not repeatedly described herein.

Though the write pulse signal including two same pulses is only a preferable solution of this embodiment, the present disclosure is not limited thereto. Alternatively, the solution may be implemented using a writing pulse signal including more than two same pulses.

Figure 6:
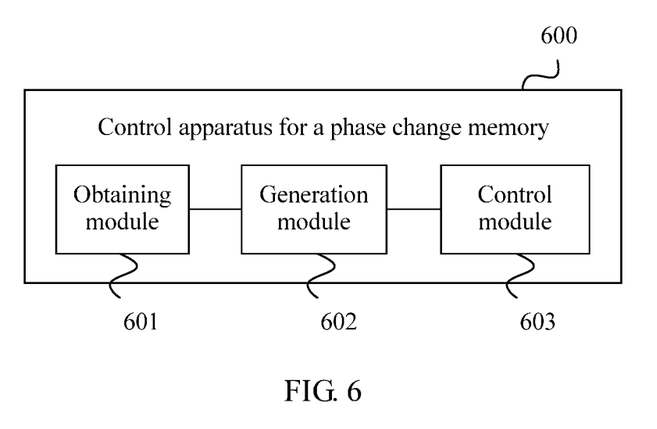
FIG. 6 is a schematic structural diagram of a control apparatus for a phase change memory according to Embodiment 5 of the present disclosure.

An embodiment further provides a control apparatus for a phase change memory. FIG. 6 is a schematic structural diagram of a control apparatus for a phase change memory according to Embodiment 5 of the present disclosure. As shown in FIG. 6, the control apparatus 600 for the phase change memory includes an obtaining module 601 configured to obtain to-be-stored data, where the to-be-stored data is multi-bit data; a generation module 602 configured to generate an erase pulse signal and a write pulse signal according to the to-be-stored data, where the write pulse signal is a signal including at least two consecutive pulses, the at least two consecutive pulses have a same amplitude, and the amplitude of the at least two consecutive pulses is a value determined according to the to-be-stored data; and a control module 603 configured to apply the erase pulse signal to a storage unit of the phase change memory to allow the storage unit to switch to a crystalline state, and apply the write pulse signal to the storage unit to allow the storage unit to switch to an amorphous state corresponding to a first resistance value, where the first resistance value and the amplitude of the at least two consecutive pulses meet a specific function relationship, so as to represent the to-be-stored data using the amorphous state corresponding to the first resistance value of the storage unit.

Further, the foregoing control apparatus 600 for the phase change memory further includes a determining module configured to determine whether the to-be-stored data is maximum data or minimum data in the multi-bit data.

The generation module 602 is further configured to generate the erase pulse signal and the write pulse signal according to the to-be-stored data when the to-be-stored data is not the maximum data or the minimum data in the multi-bit data.

Preferably, the foregoing generation module 602 is further configured to generate the erase pulse signal according to the to-be-stored data when the to-be-stored data is the maximum data or the minimum data in the multi-bit data.

The control module 603 is further configured to apply the erase pulse signal to the storage unit to allow the storage unit to switch to a crystalline state, and the crystalline state of the storage unit is used to represent the to-be-stored data.

The control apparatus for the phase change memory provided in the solution of this embodiment can implement the data storage method for the phase change memory according to any one of the foregoing embodiments. Beneficial effects of this embodiment are similar to those of the foregoing embodiments, and details are not repeatedly described herein.

Figure 7:
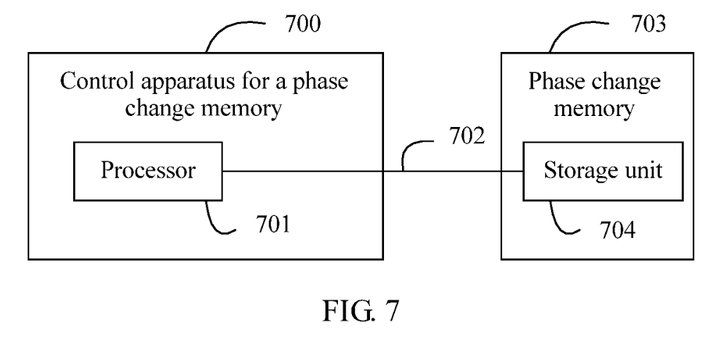
FIG. 7 is a schematic diagram of a connection between a control apparatus for a phase change memory and the phase change memory according to Embodiment 6 of the present disclosure.

An embodiment further provides a control apparatus for a phase change memory. FIG. 7 is a schematic diagram of a connection between a control apparatus for a phase change memory and the phase change memory according to Embodiment 6 of the present disclosure. As shown in FIG. 7, the control apparatus 700 for the phase change memory includes a processor 701 and a control bus 702, where the processor 701 is connected to a storage unit 704 of the phase change memory 703 using the control bus 702.

The processor 701 is configured to execute the data storage method for the phase change memory according to any one of the foregoing embodiments, and control, using the control bus 702, the storage unit 704 to perform data storage.

Preferably, the control apparatus 700 for the phase change memory further includes a memory for storing a program. The processor 701 executes the steps of the foregoing data storage method by invoking the program in the memory. The memory 701 may include a high-speed random access memory (RAM), or may further include a non-volatile memory, for example, at least one magnetic disk memory.

The control apparatus for the phase change memory provided in the solution of this embodiment can implement the data storage method for the phase change memory according to any one of the foregoing embodiments. Beneficial effects of this embodiment are similar to those of the foregoing embodiments, and details are not repeatedly described herein.

Figure 8:
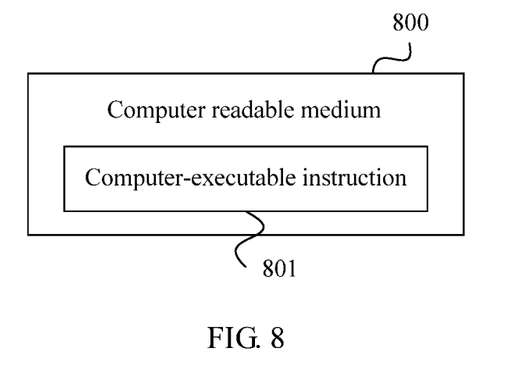
FIG. 8 is a schematic structural diagram of a computer readable medium according to Embodiment 7 of the present disclosure.

An embodiment of the present disclosure further provides a computer readable medium. FIG. 8 is a schematic structural diagram of a computer readable medium according to Embodiment 7 of the present disclosure. As shown in FIG. 8, the computer readable medium 800 includes a computer-executable instruction 801. The computer-executable instruction 801 may be invoked and executed by a processor of a computer. The computer-executable instruction includes computer instructions corresponding to the data storage method for the phase change memory according to any one of the foregoing embodiments.

The computer-executable instruction included in the computer readable medium provided in the solution of this embodiment may include computer instructions corresponding to the data storage method for the phase change memory according to any one of the foregoing embodiments, so that the computer instructions are invoked and executed by the processor of the computer. Beneficial effects of this embodiment are similar to those the foregoing embodiments, and details are not repeatedly described herein.

Persons of ordinary skill in the art may understand that all or some of the steps of the method embodiments may be implemented by a program instructing relevant hardware. The program may be stored in a computer readable storage medium. When the program runs, the steps of the method embodiments are performed. The foregoing storage medium includes any medium that can store program code, such as a read-only memory (ROM), a RAM, a magnetic disk, or an optical disc.

Finally, it should be noted that the foregoing embodiments are merely intended for describing the technical solutions of the present disclosure, but not for limiting the present disclosure.

What is claimed is:

1. A data storage method applying to a phase change memory, comprising:
    obtaining first to-be-stored data, wherein the first to-be-stored data are multi-bit data;
    generating a first erase pulse signal and a first write signal according to the first to-be-stored data, wherein the first write signal comprises at least two consecutive pulses, wherein the at least two consecutive pulses have a same amplitude, and wherein the amplitude of the at least two consecutive pulses is a value determined according to the first to-be-stored data and a number of pulses in the first write signal;
    applying the first erase pulse signal to a storage unit of the phase change memory to allow the storage unit to switch to a crystalline state; and applying the first write signal to the storage unit to allow the storage unit to switch to a first amorphous state corresponding to a first resistance value, wherein the first amorphous state represents the first to-be-stored data.

2. The method according to claim 1, wherein the at least two consecutive pulses in the first write signal have a same pulse width.

3. The method according to claim 1, further comprising:
obtaining a second to-be-stored data which is different from the first to-be-stored data, wherein the quantity of the bits in the second to-be-stored data equals to the quantity of the bits in the first to-be-stored data;
generating a second erase pulse signal and a second write signal according to the second to-be-stored data, wherein the second write signal comprises at least two consecutive pulses with a same amplitude, wherein the amplitude of the at least two consecutive pulses in the second write signal is a value determined according to the second to-be-stored data, and wherein the amplitude of the at least two consecutive pulses in the second write signal is different from the amplitude of the at least two consecutive pulses in the first write signal;
applying the second erase pulse signal to a storage unit of the phase change memory to allow the storage unit to switch to a crystalline state; and
applying the second write signal to the storage unit to allow the storage unit to switch to a second amorphous state corresponding to a second resistance value, wherein the second amorphous state represents the second to-be-stored data.

4. The method according to claim 1, further comprising:
obtaining a third to-be-stored data, wherein the third to-be-stored data equals to a preset multi-bit data, and wherein each bit in the third to-be-stored data is same;
generating a third erase pulse signal according to the third to-be-stored data; and
applying the third erase pulse signal to the storage unit to allow the storage unit to switch to a crystalline state, wherein the crystalline state of the storage unit represents the third to-be-stored data.

5. The method according to claim 2, wherein a pulse width range of the at least two consecutive pulses in the first write signal is 30 nanoseconds (ns) to 50 ns.

6. The method according to claim 1, wherein a range of an interval between the at least two consecutive pulses in the first write signal is 5 ns to 15 ns.

7. The method according to claim 1, wherein the first write signal is a voltage signal comprising at least two consecutive pulses, and an amplitude range of each of the at least two consecutive pulses in the first write signal is 0.5 volt (V) to 1.5 V.

8. A phase change memory, comprising a storage unit and a controller coupled to the storage unit, wherein the controller is configured to:
obtain first to-be-stored data, wherein the first to-be-stored data are multi-bit data;
generate a first erase pulse signal and a first write signal according to the first to-be-stored data, wherein the first write signal comprises at least two consecutive pulses, wherein the at least two consecutive pukes have a same amplitude, and wherein the amplitude of the at least two consecutive pulses is a value determined according to the first to-be-stored data and a number of pulses in the first write signal;
apply the first erase pulse signal to a storage unit of the phase change memory to allow the storage unit to switch to a crystalline state; and
apply the first write signal to the storage unit to allow the storage unit to switch to a first amorphous state corresponding to a first resistance value, wherein the first amorphous state represents the first to-be-stored data.

9. The phase change memory according to claim 8, wherein the at least two consecutive pulses in the first write signal have a same pulse width.

10. The phase change memory according to claim 8, wherein the controller is further configured to:
obtain a second to-be-stored data which is different from the first to-be-stored data, wherein the quantity of the bits in the second to-be-stored data equals to the quantity of the bits in the first to-be-stored data;
generate a second erase pulse signal and a second write signal according to the second to-be-stored data, wherein the second write signal comprises at least two consecutive pulses with a same amplitude, wherein the amplitude of the at least two consecutive pulses in the second write signal is a value determined according to the second to-be-stored data, and wherein the amplitude of the at least two consecutive pulses in the second write signal is different front the amplitude of the at least two consecutive pulses in the first write signal;
apply the second erase pulse signal to a storage unit of the phase change memory to allow the storage unit to switch to a crystalline state; and
apply the second write signal to the storage unit to allow the storage unit to switch to a second amorphous state corresponding to a second resistance value, wherein the second amorphous state represents the second to-be-stored data.

11. The phase change memory according to claim 8, wherein the controller is further configured to:
obtain a third to-be-stored data, wherein the third to-be-stored data equals to a preset multi-bit data, and wherein each bit in the third to-be-stored data is same;
generate a third erase pulse signal according to the third to-be-stored data; and
apply the third erase pulse signal to the storage unit to allow the storage unit to switch to a crystalline state, wherein the crystalline state of the storage unit represents the third to-be-stored data.

12. The phase change memory according to claim 9, wherein a pulse width range of the at least two consecutive pulses in the first write signal is 30 nanoseconds (ns) to 50 ns.

13. The phase change memory according to claim 8, wherein a range of an interval between the at least two consecutive pulses in the first write signal is 5 ns to 15 ns.

14. The phase change memory according to claim 8, wherein the first write signal is a voltage signal comprising at least two consecutive pulses, and an amplitude range of each of the at least two consecutive pulses in the first write signal is 0.5 volt (V) to 1.5 V.

* * * * *

UNITED STATES PATENT AND TRADEMARK OFFICE
CERTIFICATE OF CORRECTION

PATENT NO. : 9,899,084 B2
APPLICATION NO. : 15/412509
DATED : February 20, 2018
INVENTOR(S) : Zhen Li et al.

It is certified that error appears in the above-identified patent and that said Letters Patent is hereby corrected as shown below:

Column 17; Line 61; Claim 8 should read:
wherein the at least two consecutive pulses have a same Signed and Sealed this
Twenty-second Day of May, 2018

Andrei Iancu
*Director of the United States Patent and Trademark Office*